United States Patent
Schneider et al.

(10) Patent No.: US 12,120,821 B2
(45) Date of Patent: Oct. 15, 2024

(54) FLEXIBLE JUMPER WITH A MOUNTING FRAME

(71) Applicant: Ennovi Industries, Inc., East Providence, RI (US)

(72) Inventors: Richard Schneider, Livonia, MI (US); Richard A. Johannes, Trabuco Canyon, CA (US)

(73) Assignee: ENNOVI INDUSTRIES, INC., East Providence, RI (US)

( * ) Notice: Subject to any disclaimer, the term of this patent is extended or adjusted under 35 U.S.C. 154(b) by 102 days.

(21) Appl. No.: 17/920,960

(22) PCT Filed: Apr. 26, 2021

(86) PCT No.: PCT/US2021/029174
§ 371 (c)(1),
(2) Date: Oct. 24, 2022

(87) PCT Pub. No.: WO2021/222110
PCT Pub. Date: Nov. 4, 2021

(65) Prior Publication Data
US 2023/0209714 A1  Jun. 29, 2023

Related U.S. Application Data

(60) Provisional application No. 63/017,631, filed on Apr. 29, 2020, provisional application No. 63/034,349, filed on Jun. 3, 2020.

(51) Int. Cl.
*H05K 1/14* (2006.01)
*H01R 12/52* (2011.01)
(Continued)

(52) U.S. Cl.
CPC ............. *H05K 1/148* (2013.01); *H01R 12/52* (2013.01); *H01R 12/62* (2013.01); *H01R 12/91* (2013.01);
(Continued)

(58) Field of Classification Search
CPC ........ H05K 1/147; H05K 1/148; H05K 3/363; H05K 2201/10598; H01R 12/52; H01R 12/62; H01R 12/91
See application file for complete search history.

(56) References Cited

U.S. PATENT DOCUMENTS 5,917,149 A   6/1999  Barcley
8,083,541 B2  12/2011 Yeh
(Continued)

FOREIGN PATENT DOCUMENTS

KR   20090010003 U   10/2009
KR   1020110031074 A  3/2011

OTHER PUBLICATIONS

International Search Report for PCT/US2021/029174 dated Aug. 12, 2021.
(Continued)

*Primary Examiner* — Paresh Paghadal
(74) *Attorney, Agent, or Firm* — Paul Katterle

(57) ABSTRACT

A jumper assembly for connecting together first and second circuit boards. The jumper assembly includes a frame secured to a flexible circuit having a plurality of conductive traces. The frame includes a bridge that connects together first and second side structures, each having a window and a moveable lever. The first side structure is secured over the first circuit board and the second side structure is secured over the second circuit board. First end portions of the traces of the flexible circuit are secured to contact pads of the first circuit board, while second end portions of the traces of the
(Continued)

flexible circuit are secured to contact pads of the second circuit board. The bridge of the frame is removed after the jumper assembly is secured to the first and second circuit boards.

20 Claims, 14 Drawing Sheets

(51) Int. Cl.
  *H01R 12/62*     (2011.01)
  *H01R 12/91*     (2011.01)
  *H05K 3/36*      (2006.01)
(52) U.S. Cl.
  CPC ............. *H05K 1/147* (2013.01); *H05K 3/363* (2013.01); *H05K 2201/10598* (2013.01); *H05K 2203/167* (2013.01)

(56) References Cited

U.S. PATENT DOCUMENTS

| | | |
|---|---|---|
| 2010/0112833 A1 | 5/2010 | Jeon |
| 2011/0067903 A1 | 3/2011 | Lin |
| 2019/0317568 A1 | 10/2019 | Schnell |

OTHER PUBLICATIONS

Written Opinion of ISA for PCT/US2021/029174 dated Aug. 12, 2021.

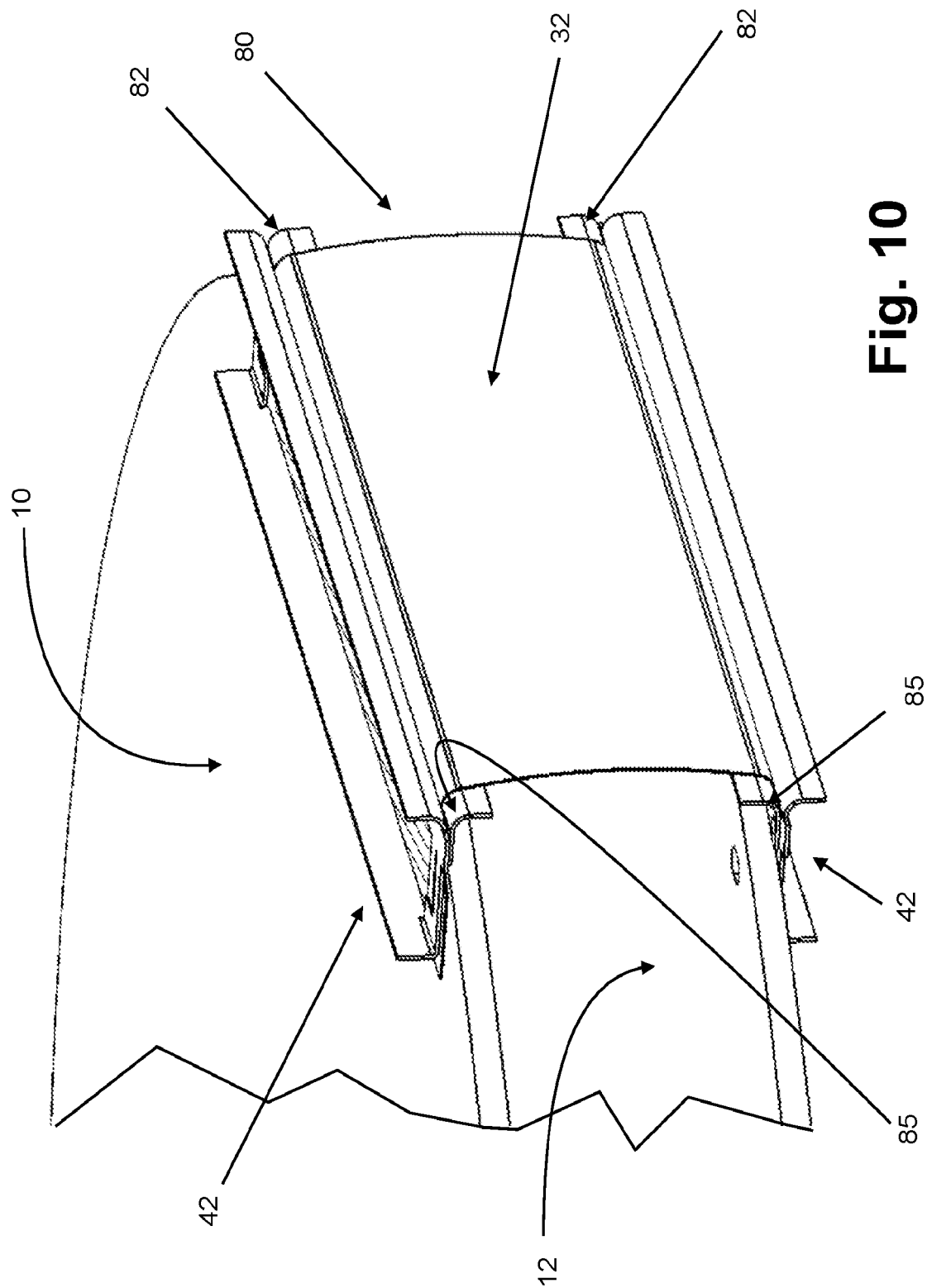

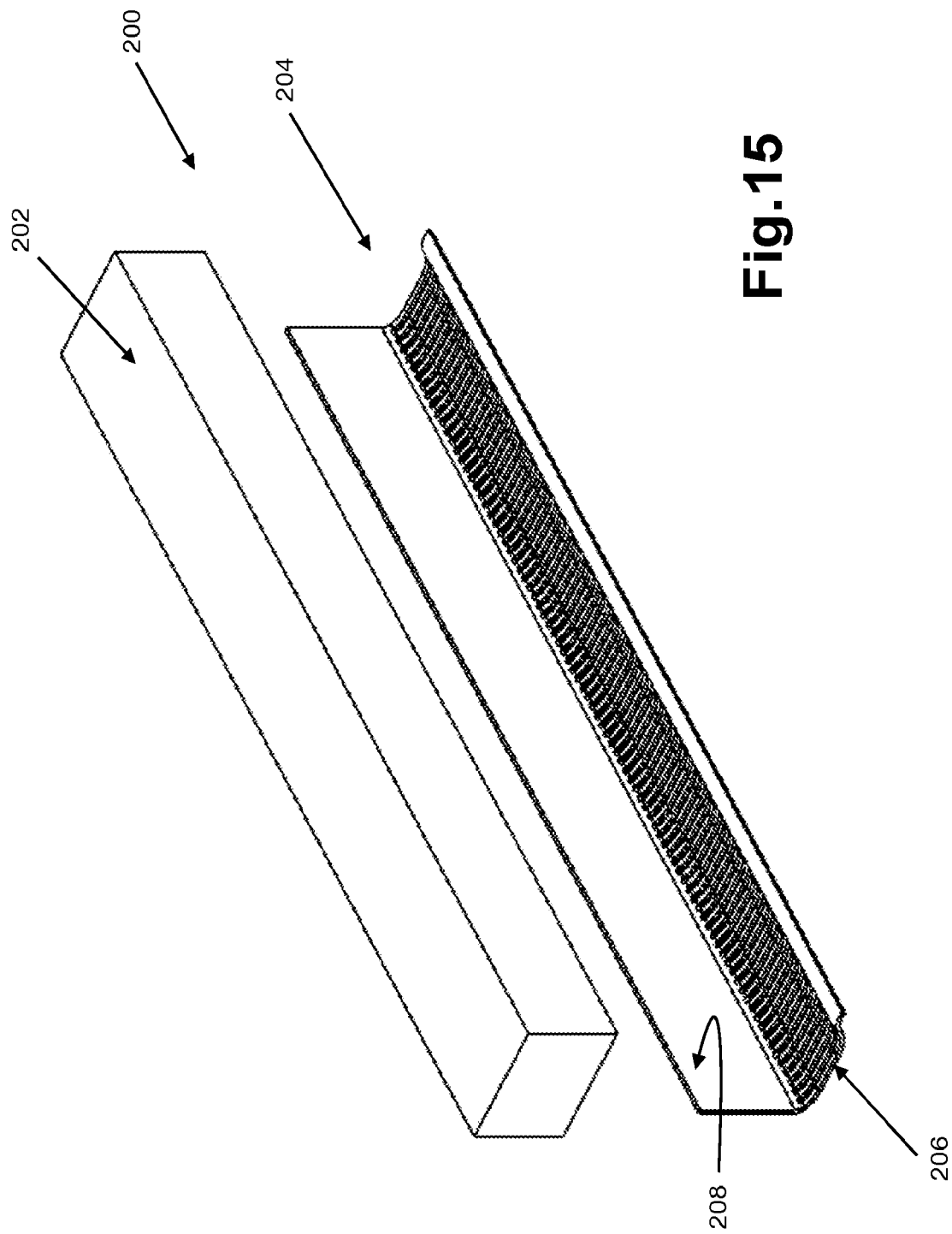

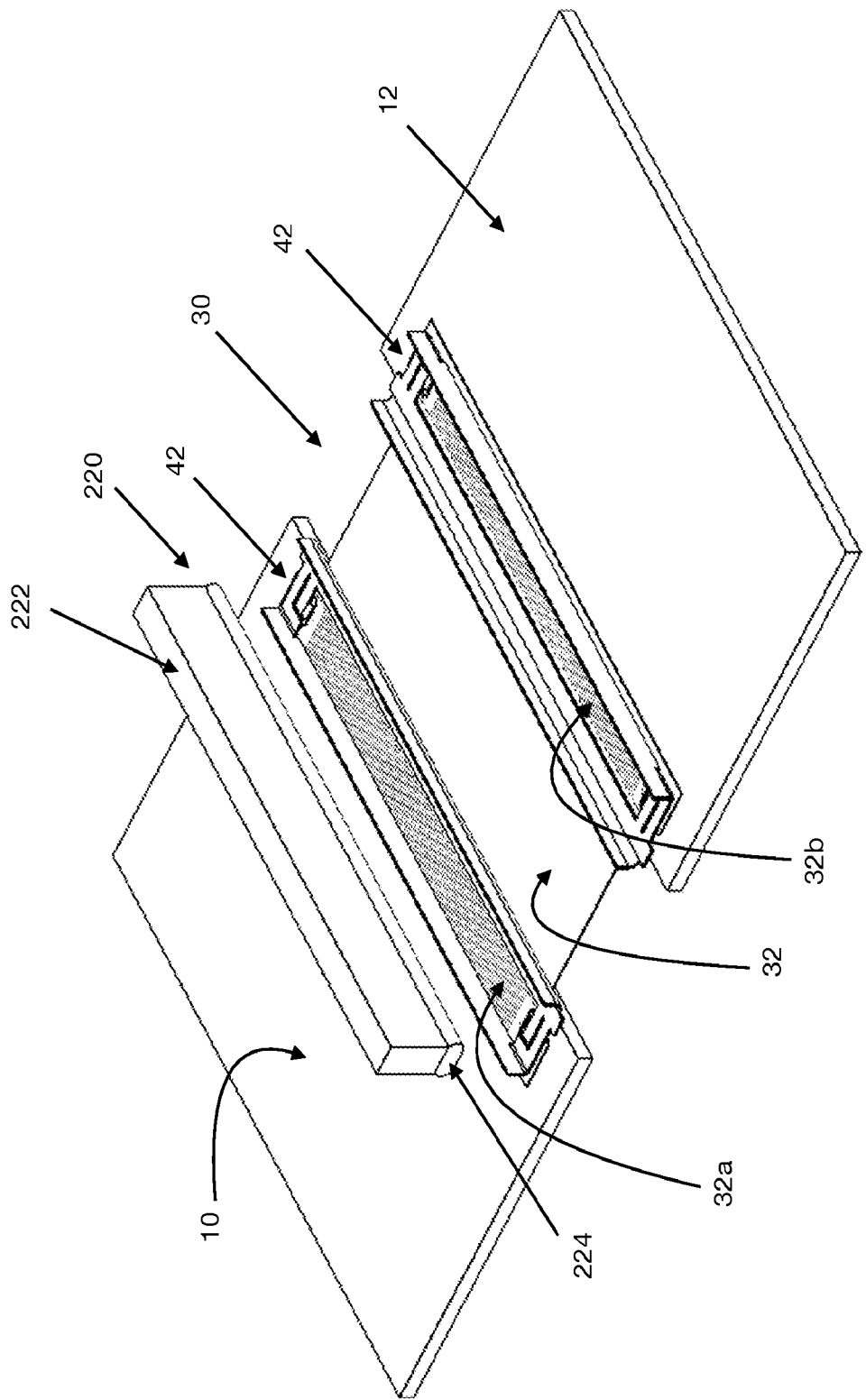

FLEXIBLE JUMPER WITH A MOUNTING FRAME

CROSS-REFERENCE TO RELATED APPLICATION(S)

This application is the U.S. national phase of PCT Application No. PCT/US2021/029174 filed on 26 Apr. 2021, which claims the benefit of priority under 35 U.S.C. § 119(e) to U.S. Provisional Patent Application No. 63/017,631 filed on 29 Apr. 2020, and U.S. Provisional Patent Application No. 63/034,349 filed on 3 Jun. 2020, which are both herein incorporated by reference.

TECHNICAL FIELD

This disclosure relates generally to connectors for interconnecting electrical/electronic substrates, such as printed circuit boards (PCBs) and, more specifically, to such connectors that permit the substrates to be moved relative to each other.

BACKGROUND

In a number of applications, an electrical/electronic assembly requires separate printed circuit boards (PCBs) to be connected together to convey a large number of signals therebetween. Often, such an assembly must be enclosed in a small space where the two PCBs may not be aligned with each other. As a result, many conventional connectors cannot be used to make the signal connections between the two PCBs due to size constraints and/or positioning requirements. Accordingly, it would be desirable to provide a signal connector that can interconnect two PCBs in a small space where the two PCBs may not be aligned with each other.

SUMMARY

In accordance with the present disclosure, a jumper assembly is provided for connecting together first and second circuit structures. The jumper assembly includes a flexible circuit that has a plurality of conductive traces adjoining at least one dielectric layer. The conductive traces have first and second end portions disposed in first and second side portions of the flexible circuit, respectively, and are exposed through the at least one dielectric layer. A frame is secured to the flexible circuit and includes first and second side structures connected together by a bridge. The first side structure defines a first window and includes at least one first fastener that is movable to engage the first circuit structure. The second side structure defines a second window and includes at least one second fastener that is movable to engage the second circuit structure. The first side structure is disposed over the first side portion of the flexible circuit such that the first end portions of the flexible circuit are aligned with the first window. The second side structure is disposed over the second side portion of the flexible circuit such that the second end portions of the flexible circuit are aligned with the second window.

Also provided in accordance with the present disclosure is a method of forming a circuit assembly from the jumper assembly and first and second circuit boards. The first circuit board includes an array of first contact pads, and the second circuit board includes an array of second contact pads. The jumper assembly is positioned over the first and second circuit boards such that the first side structure is disposed over the first circuit board and the second side structure is disposed over the second circuit board. The first end portions of the traces of the flexible circuit are secured to the first contact pads of the first circuit board, and the second end portions of the traces of the flexible circuit are secured to the second contact pads of the second circuit board. The bridge is removed from the frame.

BRIEF DESCRIPTION OF THE DRAWINGS

The features, aspects, and advantages of the present invention will become better understood with regard to the following description, appended claims, and accompanying drawings where:

FIG. 10 is a partial perspective view of the jumper assembly of FIG. 9 connecting together two PCBs, wherein a bridge section of the frame of the jumper assembly has been removed;

FIG. 15 shows a top perspective view of the first compression assembly of FIG. 14 with a push bar and a stamped pusher of the first compression assembly being spaced from each other; and FIG. 16 shows a top perspective view of the jumper assembly of FIG. 2 positioned between portions of the two PCBs, wherein a bridge section of the frame of the jumper assembly has been removed, and wherein a second compression assembly is about to be used to press a side portion of the flexible circuit against one of the PCBs to make solderless connections therebetween.

DESCRIPTION OF ILLUSTRATIVE EMBODIMENTS

Figure 1:
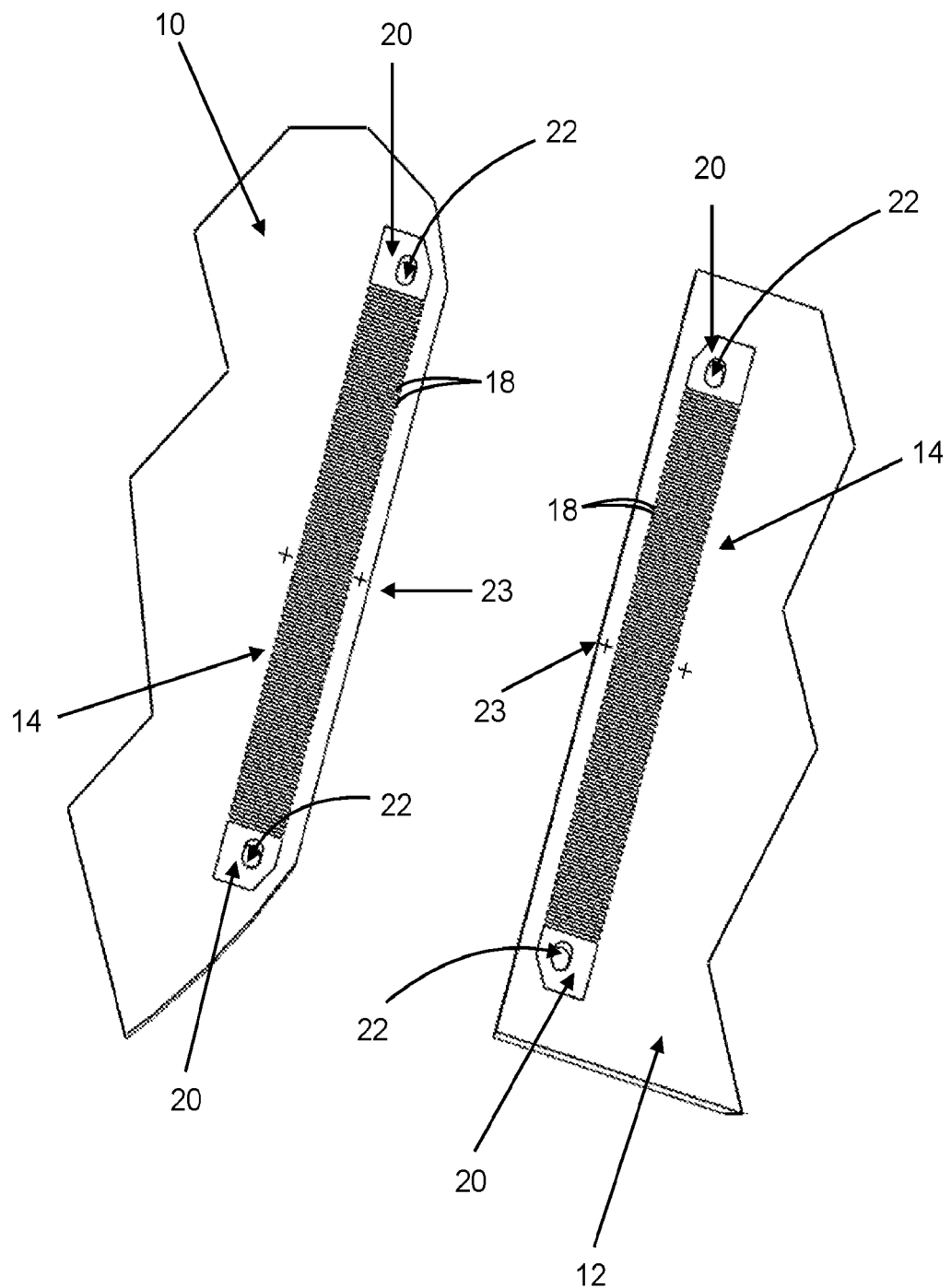
FIG. 1 is a top perspective view of portions of two printed circuit boards (PCBs) that are to be connected together.

Spatially relative terms, such as "top", "bottom", "lower", "above", "upper", and the like, are used herein merely for ease of description to describe one element or feature's relationship to another element(s) or feature(s) as they are illustrated in (a) drawing figure(s) being referred to. It will be understood that the spatially relative terms are not meant to be limiting and are intended to encompass different orientations of the device in use or operation in addition to the orientation depicted in the drawings.

Referring now to FIG. 1, there is shown first and second printed circuit boards (PCBs) 10, 12 that are to be connected together as part of an electrical/electronic assembly. The first and second PCBs 10, 12 include circuitry (not shown) that may interconnect different electronic/electrical devices physically mounted to the first and second PCBs 10,12. In addition, each of the first and second PCBs 10, 12 includes a contact arrangement 14 for connecting the circuitry of the PCB to the circuitry in the other PCB. The contact arrangement 14 is disposed toward an edge of the PCB. Each contact arrangement 14 includes a series of spaced-apart contact pads 18 disposed between a pair of outer anchor pads 20. The contact pads 18 and the anchor pads 20 are formed from a conductive metal, such as a copper alloy, and are mounted to the PCB so as to have their outer surfaces (on at least one side of the PCB) exposed and readily accessible, such as by extending slightly above a surface of the PCB. Solder paste is silk screened on the contact pads 18 and the anchor pads 20. Preferably, the solder paste is deposited so as to have a thickness of from about 0.1 mm to about 0.15 mm on each of the contact pads 18 and the anchor pads 20. Each anchor pad 20 has an opening or bore 22 extending therethrough. In this manner, each contact arrangement 14 includes a pair of bores 22.

Fiducials 23 are etched into the first and second PCBs 10, 12 to mark the locations of the contact arrangements 14 for use by cameras of a robot that may be used to secure a jumper assembly 30 (described below) between the first and second PCBs 10,12. The fiducials 23 may be disposed on opposite sides of each of the contact arrangements 14. The fiducials 23 may be created from the same photomask used to form a contact arrangement 14, so the fiducials 23 are very precisely located, relative to the contact arrangement 14.

Figure 2:
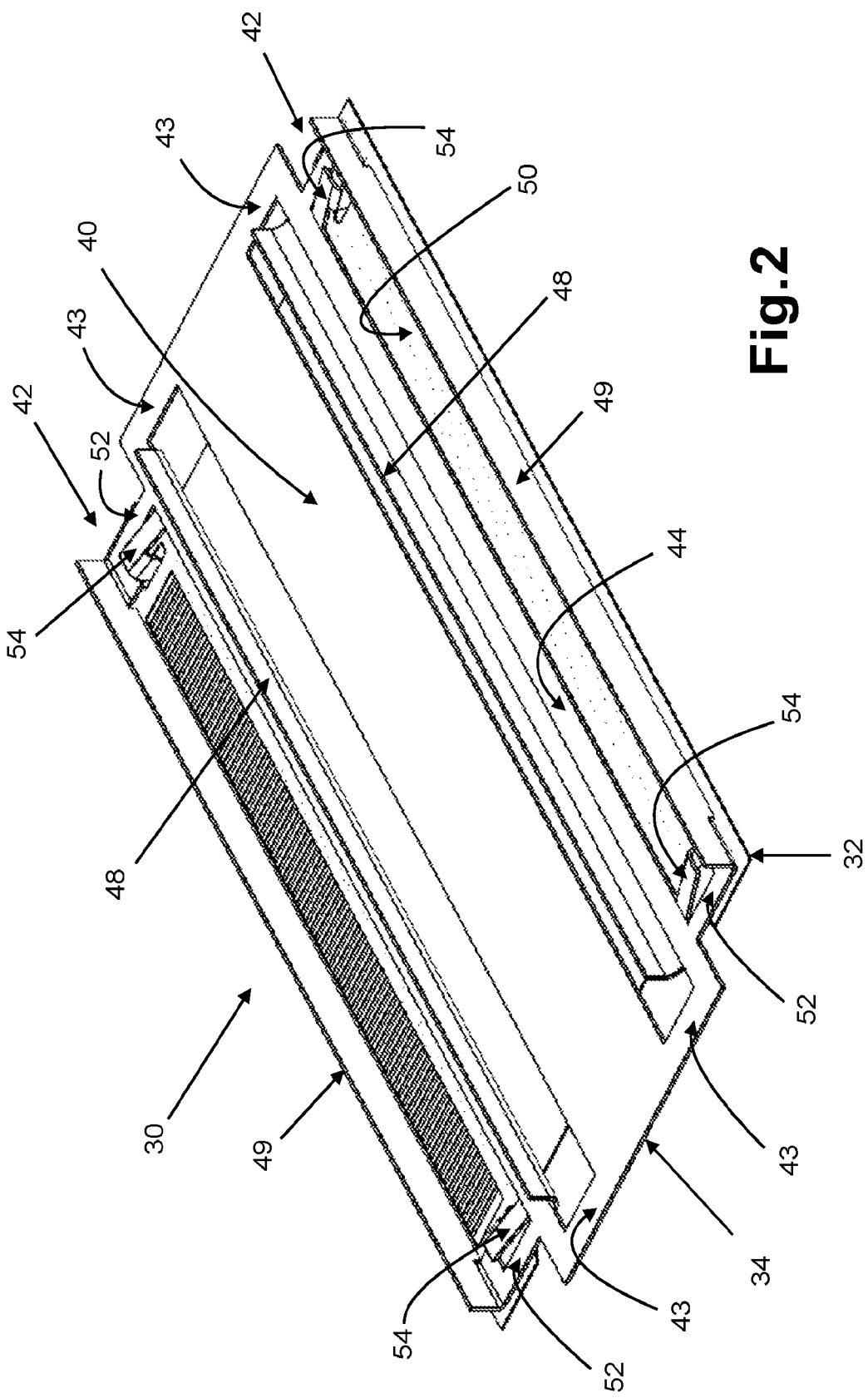
FIG. 2 is a top perspective view of a jumper assembly that may be used to connect together the two PCBs.
Figure 3:
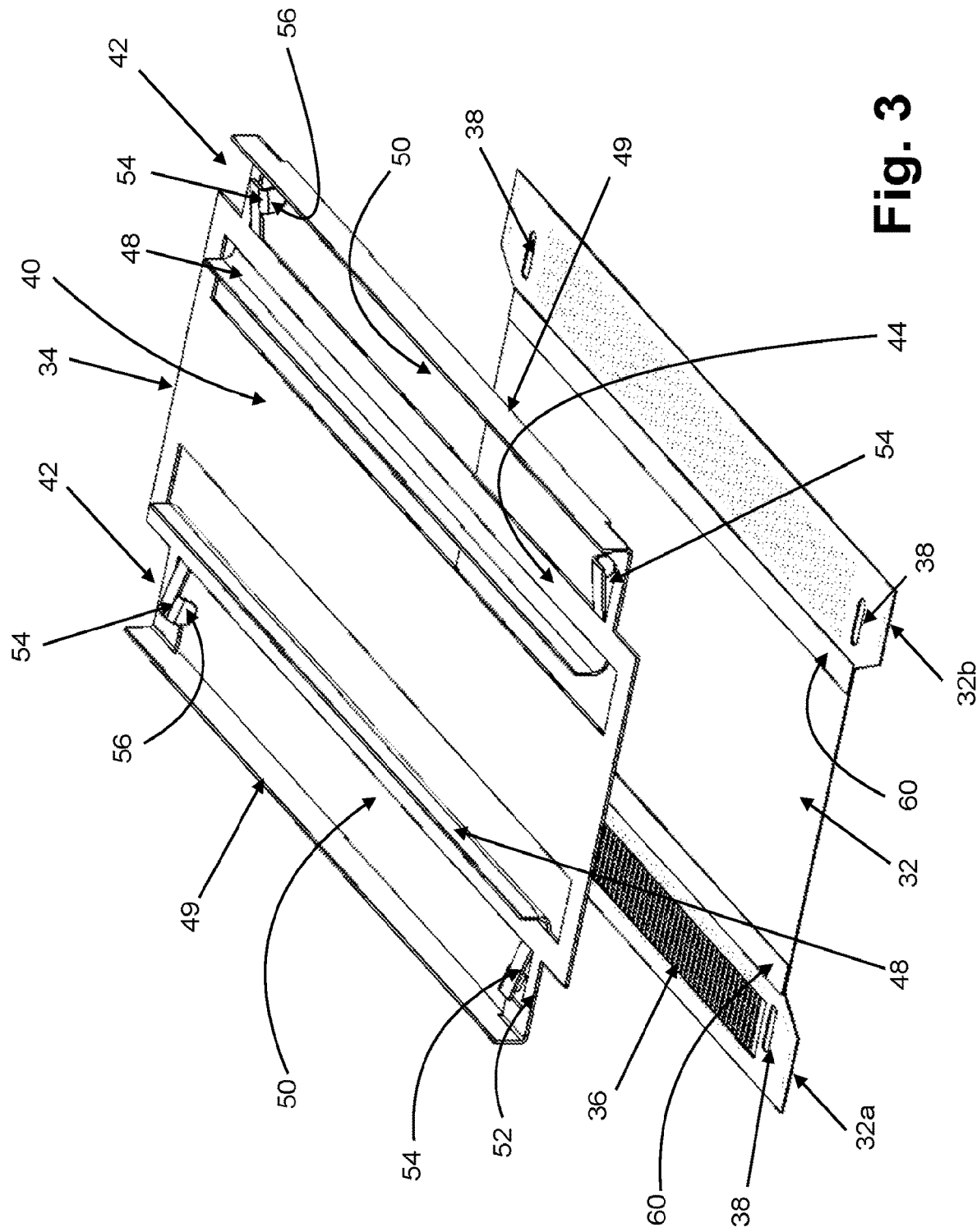
FIG. 3 is a top perspective view of the jumper assembly with a frame spaced above a flexible circuit.

Referring now to FIGS. 2 and 3, there is shown a jumper assembly 30 that is used to connect together the first and second PCBs 10,12. The jumper assembly 30 includes a flexible circuit 32 and a frame 34.

The flexible circuit 32 has opposing top and bottom surfaces that are planar when the flexible circuit 32 is an unbent state. The flexible circuit 32, however, is thin and flexible so as to be facilely bendable. The flexible circuit 32 includes a plurality of elongated conductive traces arranged parallel to each other, in a spaced-apart manner. The traces extend in a lateral direction, between opposing side portions 32a,b of the flexible circuit 32. The flexible circuit 32 may have a coverlay construction or a solder mask construction. With a coverlay construction, the flexible circuit 32 may include a flexible core (with the conductive traces) having flexible layers of polyimide secured to opposing sides of the core by flexible layers of adhesive. The flexible adhesive layers may each have a thickness of about 17.5 µm, while the polyimide layers may each have a thickness of about 12.5 µm. Of course, other thicknesses may be used. With a solder mask construction, the flexible circuit 32 may include a flexible core (with the conductive traces) coated on both sides with a flexible liquid photoimageable solder mask having a thickness of about 25 µm or other thickness.

Figure 4:
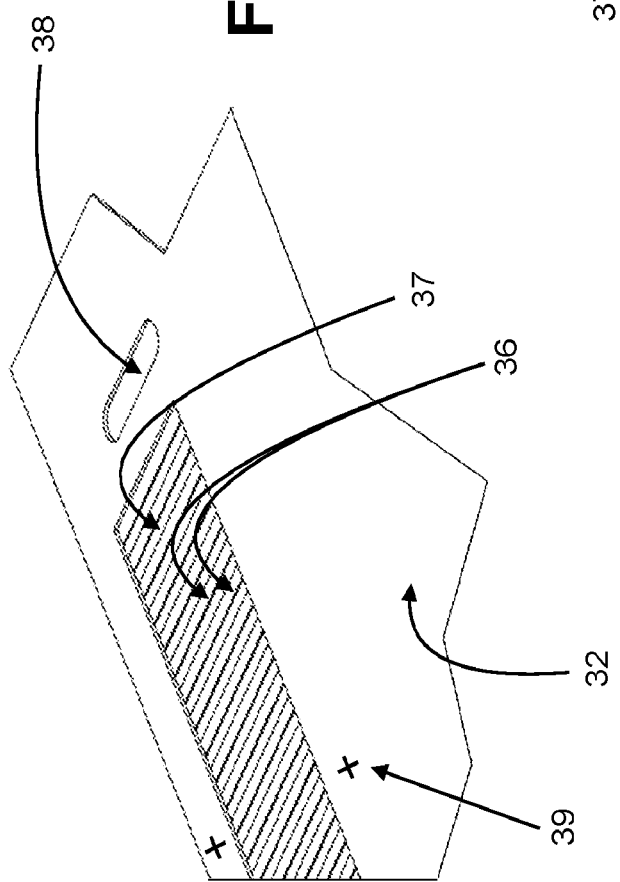
FIG. 4 is a close-up perspective view of a top portion of the flexible circuit of the jumper assembly.
Figure 5:
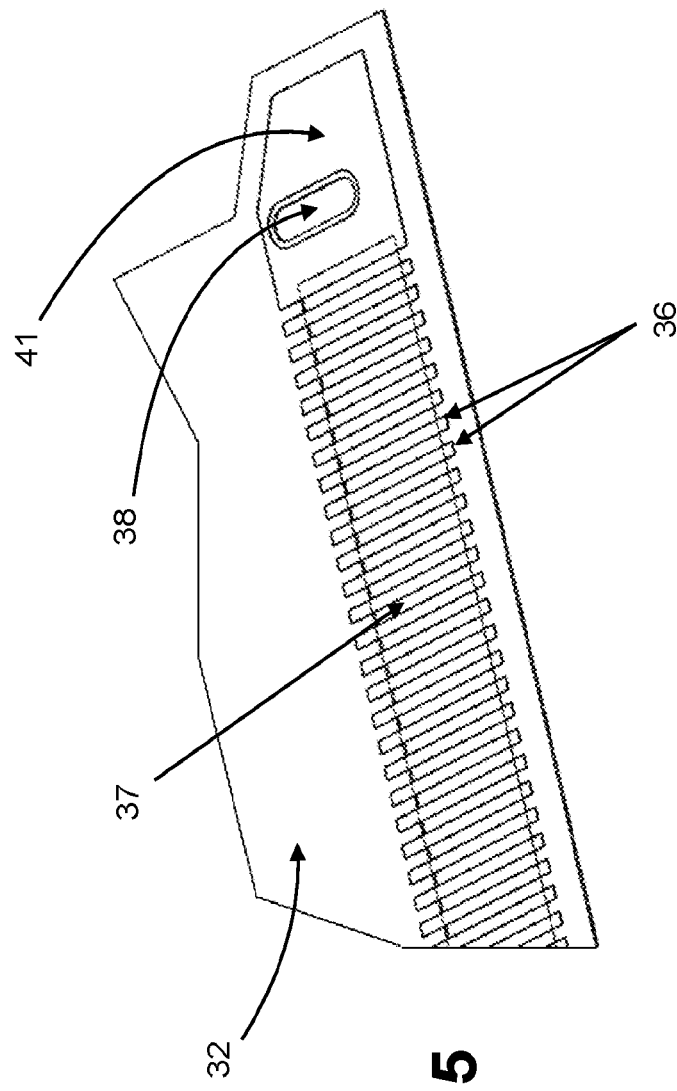
FIG. 5 is a close-up perspective view of a bottom portion of the flexible circuit of the jumper assembly.

The core of the flexible circuit 32 may have circuits (including traces) on one or both sides of the core. the circuits may be composed of any conductive metal, such as gold, tin, silver, indium, etc. End portions or pads 36 of the traces in the side portions 32a,b are exposed on at least the bottom surface of the flexible circuit 32. The trace pads 36 are arranged in a linear array. In some embodiments, the pads 36 may be exposed on both the top and bottom surfaces of the flexible circuit 32, i.e., are unsupported. For example, the trace pads 36 may be disposed in an open window 37 formed in the flexible circuit 32, such as shown in FIGS. 4 and 5 for side portion 32a. In each side portion 32a,b, the linear array of trace pads 36 are bracketed by a pair of end pads 41 that are exposed on the bottom surface of the flexible circuit 32, as shown in FIG. 5. Openings or slots 38 are formed in opposing ends of the side portions 32a,b, respectively. The slots 38 extend through the end pads 41.

Fiducials 39 are etched into the flexible circuit 32 to mark the locations of the arrays of the trace pads 36 for use by cameras of a robot that may be used to secure the jumper assembly 30 between the first and second PCBs 10,12. The fiducials 39 may be disposed on opposite sides of an array of the trace pads 36. The fiducials 39 may be created from the same photomask used to form an array of the trace pads 36, so they are very precisely located relative to the array of the trace pads 36.

Returning to FIGS. 2 and 3, the frame 34 may be a unitary structure, composed of metal, and may be formed by stamping. The metal may be of any composition, such as steel, copper or aluminum, or an alloy thereof, and may be plated or unplated. The frame 34 includes a bridge section 40 connected between side retainers 42. The bridge section 40 has a flat plate shape and is connected to the side retainers 42 by sacrificial members 43, which may be weakened to facilitate their separation from the side retainers 42. For example, scores may be formed in the sacrificial members 43 at their junctures with the side retainers 42, respectively. Each of the side retainers 42 is generally channel-shaped and includes a base structure 44 joined to a bend of a first rail 48. A second rail 49 is spaced from the base structure 44 to form an enlarged window 50 in-between. The second rail 49 is connected to the base structure 44 by narrow strips 52 at opposing ends of the side retainer 42. The first and second rails 48, 49 extend upwardly, away from the rest of the frame 34 at about 90 degree angles, respectively. The first and second rails 48, 49 may have different configurations, particularly toward their free edges. In each side retainer 42, cantilevered levers 54 extend obliquely upward from the base structure 44, adjacent to the strips 52, respectively. The levers 54 each include a downwardly-extending anchor 56 adapted for insertion through the slots 38 in the flexible circuit 32 and receipt in the bores 22 of the anchor pads 20, respectively. The anchors 56 may be solid and contoured, such as tapered or rounded, as shown. Alternately, the anchors 56 may have a spring-type construction, such as an eye-of-the-needle (EON) type of construction in which a pair of beams are separated by a piercing.

Initially, the levers 54 extend upwardly, at an oblique angle, from the inner structures of the side retainers 42, such that their anchors 56 do not extend below the base structures 44. As described below, however, the levers 54 are later bent downward such that the anchors 56 extend below the base structures 44 of the side retainers 42.

With particular reference to FIG. 3, the frame 34 may be secured to the flexible circuit 32 by adhesive strips 60 disposed between the bottom surfaces of the base structures 44 of the side retainers 42 and the flexible circuit 32. The adhesive strips 60 may be double-sided adhesive tape or adhesive deposited on the side retainers 42 and/or the flexible circuit 32. In lieu of, or in addition to, the adhesive strips 60, the frame 34 may be secured to the flexible circuit 32 by mechanical clinches or by soldering.

The frame 34 is secured to the flexible circuit 32 such that the anchors 56 of the levers 54 are aligned with the slots 38 in the flexible circuit 32 and the trace pads 36 of the flexible circuit 32 are exposed and accessible through the windows 50 of the side retainers 42, respectively, all as shown in FIG. 2.

The jumper assembly 30 may be secured between the first and second PCBs 10, 12 in a method using one or more robots having placement cameras, one or more arms equipped with a vacuum pick-up and a control system for controlling the robot arm(s). In accordance with the method, the first and second PCBs 10,12 are initially fixed in a predetermined position relative to each other, such that at least top surfaces of the first and second PCBs 10,12 are coplanar. The vacuum pick-up of a robot arm is attached to the bridge section 40 of the frame 34 and then the robot arm is moved by the control system to properly locate the jumper assembly 30 between the first and second PCBs 10,12. More specifically, the jumper assembly 30 is positioned such that: (i.) the trace pads 36 of the side portion 32*a* of the flexible circuit 32 are aligned with the contact pads 18 of the first PCB 10, respectively, and are in contact with the solder paste disposed thereon; (ii.) the trace pads 36 of the side portion 32*b* of the flexible circuit 32 are aligned with the contact pads 18 of the second PCB 12, respectively, and are in contact with the solder paste disposed thereon; (iii.) the end pads 41 of the side portion 32*a* of the flexible circuit 32 are aligned with the anchor pads 20 of the first PCB 10, respectively, and are in contact with the solder paste disposed thereon; and (iv.) the end pads 41 of the side portion 32*b* of the flexible circuit 32 are aligned with the anchor pads 20 of the second PCB 12, respectively, and are in contact with the solder paste disposed thereon. The control system properly locates the jumper assembly 30 between the first and second PCBs 10, 12 using the fiducials 23, 39, which are detected by the placement cameras.

Figure 6:
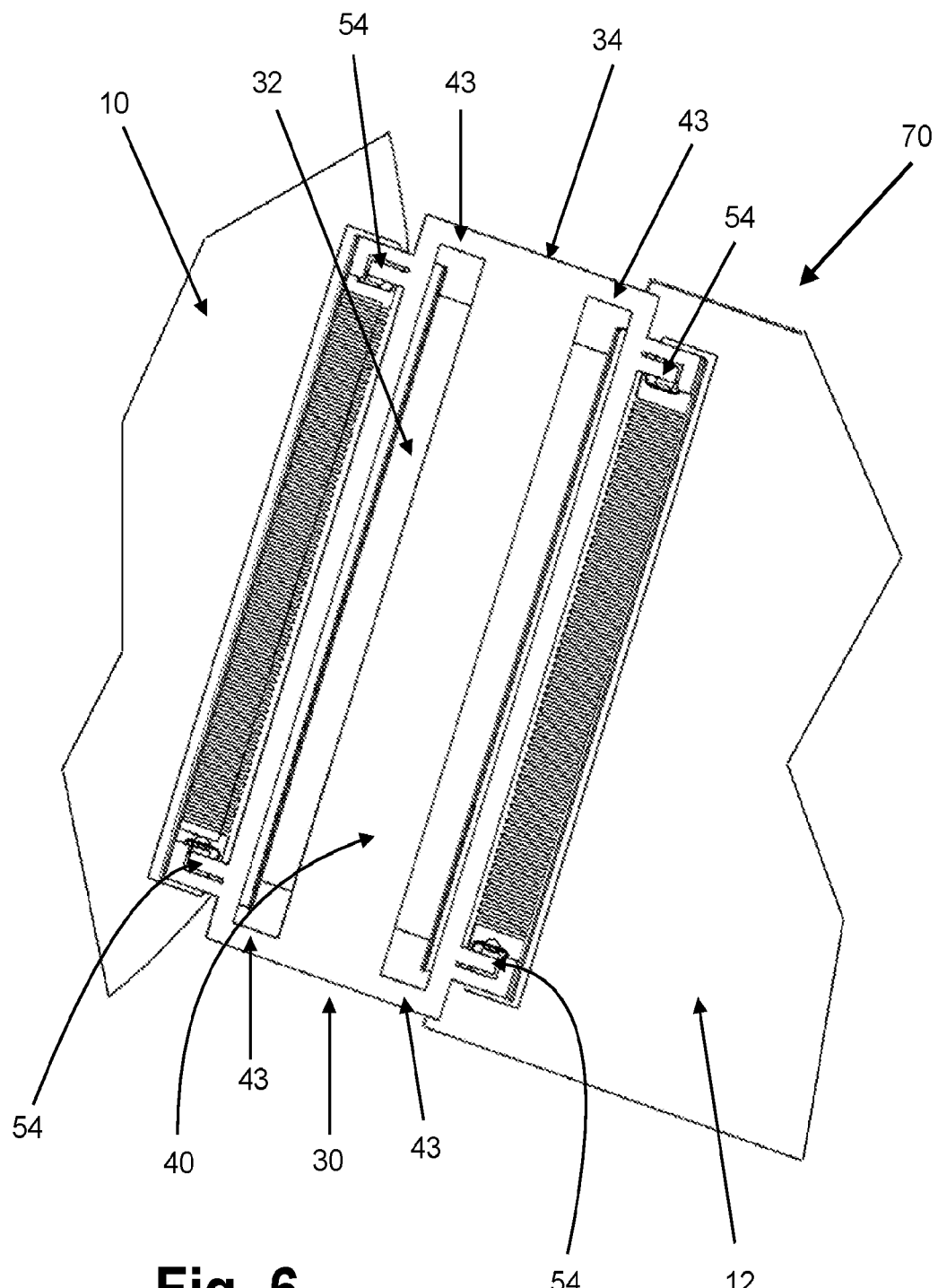
FIG. 6 is a top perspective view of the jumper assembly positioned between portions of the two PCBs.

When the jumper assembly 30 is properly positioned as described above, the anchors 56 of the levers 54 are aligned with the slots 38 in the flexible circuit 32, which are aligned with the bores 22 in the first and second PCBs 10, 12, respectively. With this positioning, the levers 54 are bent downward such that their anchors 56 are received in the bores 22 of the PCBs 10,12, respectively, thereby mechanically securing the jumper assembly 30 between the PCBs 10, 12, as shown in FIG. 6. The levers 54 may be bent downward using a tool of the robot, which may be combined with the vacuum pick-up. In addition to moving the anchors 56 into the bores 22 of the PCBs 10, 12, the downward movement of the levers 54 also causes the side retainers 42 to lie flat against the flex circuit 32 (and the first and second PCBs 10, 12 below), which further helps secure the flex circuit 32 to the PCBs 10, 12. The anchors 56 help stabilize the alignment of the trace pads 36 of the flexible circuit 32 with the contact pads 18 of the first and second PCBs 10, 12.

It should be noted that solder paste may optionally be applied to the anchors 56 and/or inside the bores 22 in the first and second PCBs 10, 12 in order to solder the anchors 56 to the PCBs 10, 12 during the reflow process described below.

After the jumper assembly 30 has been mechanically secured between the first and second PCBs 10,12, the resulting PCB assembly 70 may be placed in a reflow solder oven, where the PCB assembly 70 is subjected to controlled heat. The application of the heat causes the solder paste on the contact pads 18 and the anchor pads 20 of the first and second PCBs 10, 12 to reflow in a molten state. Upon subsequent cooling, permanent solder joints are formed between the contact pads 18 of the first and second PCBs 10, 12 and the trace pads 36 of the flexible circuit 32, respectively, and permanent solder joints are formed between the anchor pads 20 of the first and second PCBs 10, 12 and the end pads 41 of the flexible circuit 32.

In lieu of being soldered together in a reflow solder oven, the trace pads 36 and the end pads 41 of the flexible circuit 32 may be soldered to the contact pads 18 and the anchor pads 20, respectively, of the first and second PCBs 10, 12 by a "hot bar" solder process. In this process, a hot bar is lightly pressed onto the top side of the flex circuit 32 (over the trace pads 36 and the end pads 41) so the hot bar melts the solder paste on the contact pads 18 and the anchor pads 20 below. A localized infrared reflow process may also be used. In embodiments described further below, the trace pads 36 and the end pads 41 of the flexible circuit 32 may be secured to the contact pads 18 and the anchor pads 20, respectively, of the first and second PCBs 10, 12 without using solder.

Figure 7:
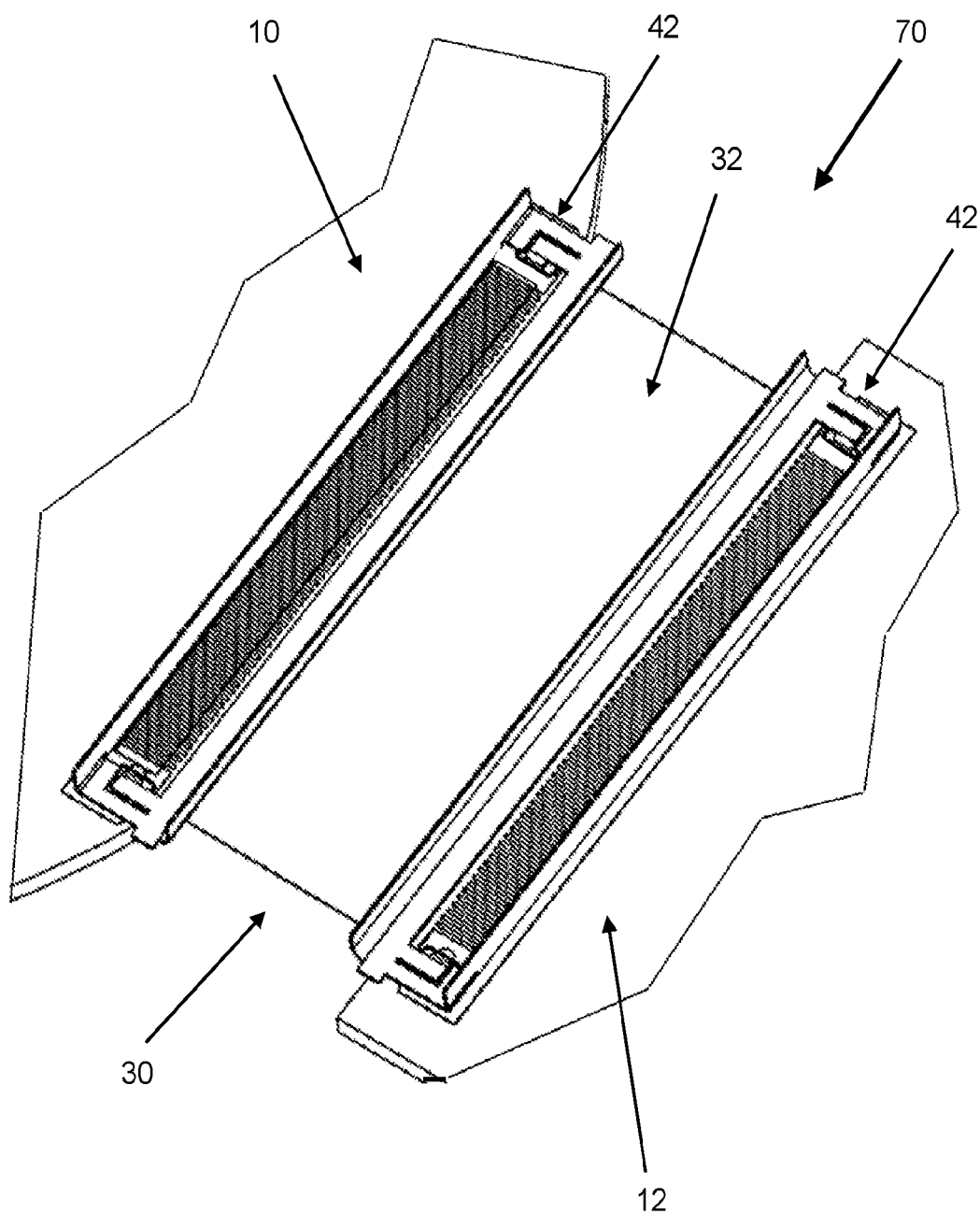
FIG. 7 is a top perspective view of the jumper assembly secured between portions of the two PCBs, wherein a bridge section of the frame of the jumper assembly has been removed.
Figure 8:
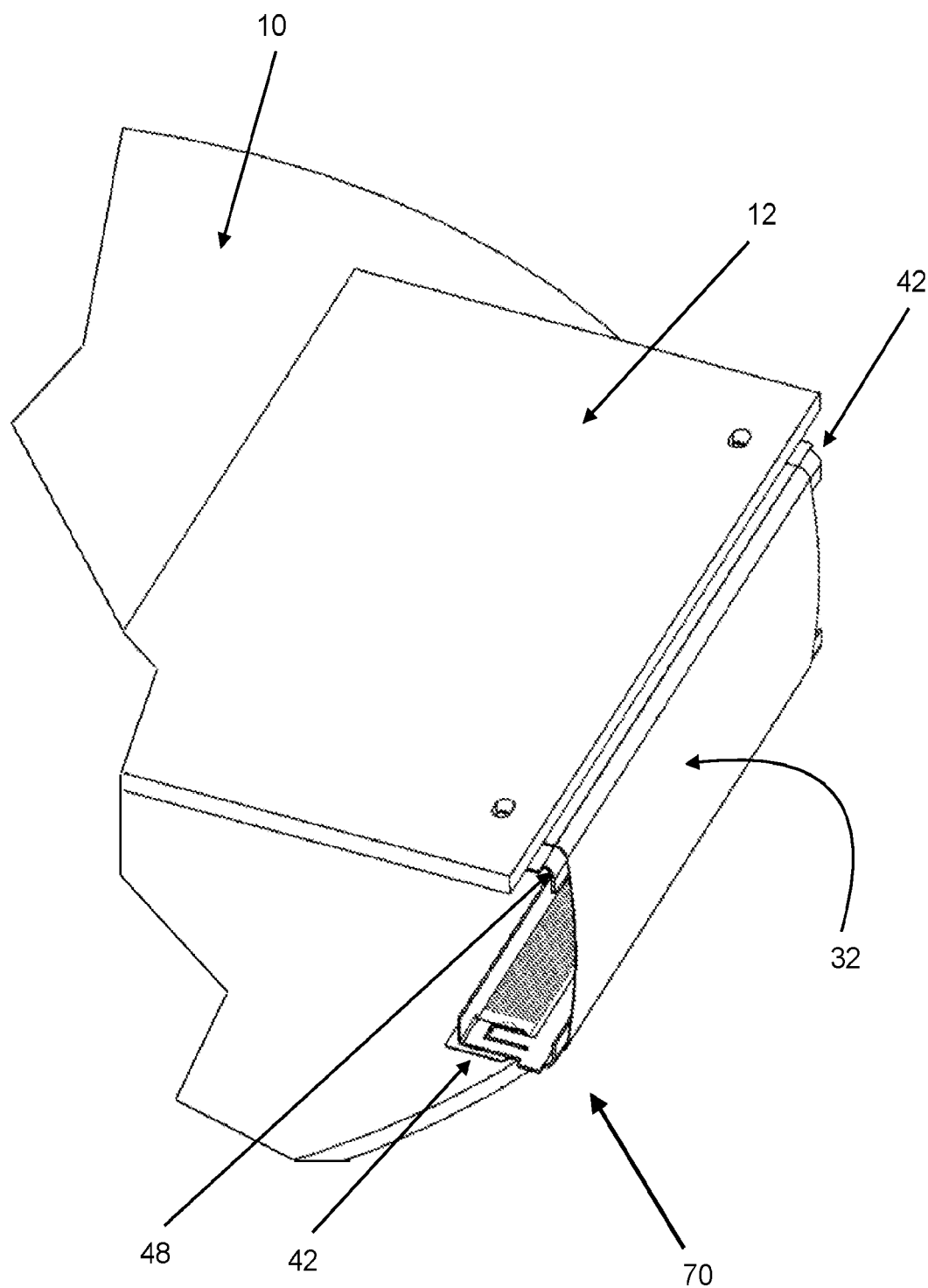
FIG. 8 is a side perspective view of the jumper assembly, with the bridge section removed, secured between portions of the two PCBs, wherein the two PCBs have been moved relative to each other such that the flex circuit is bent at right angles.
Figure 9:
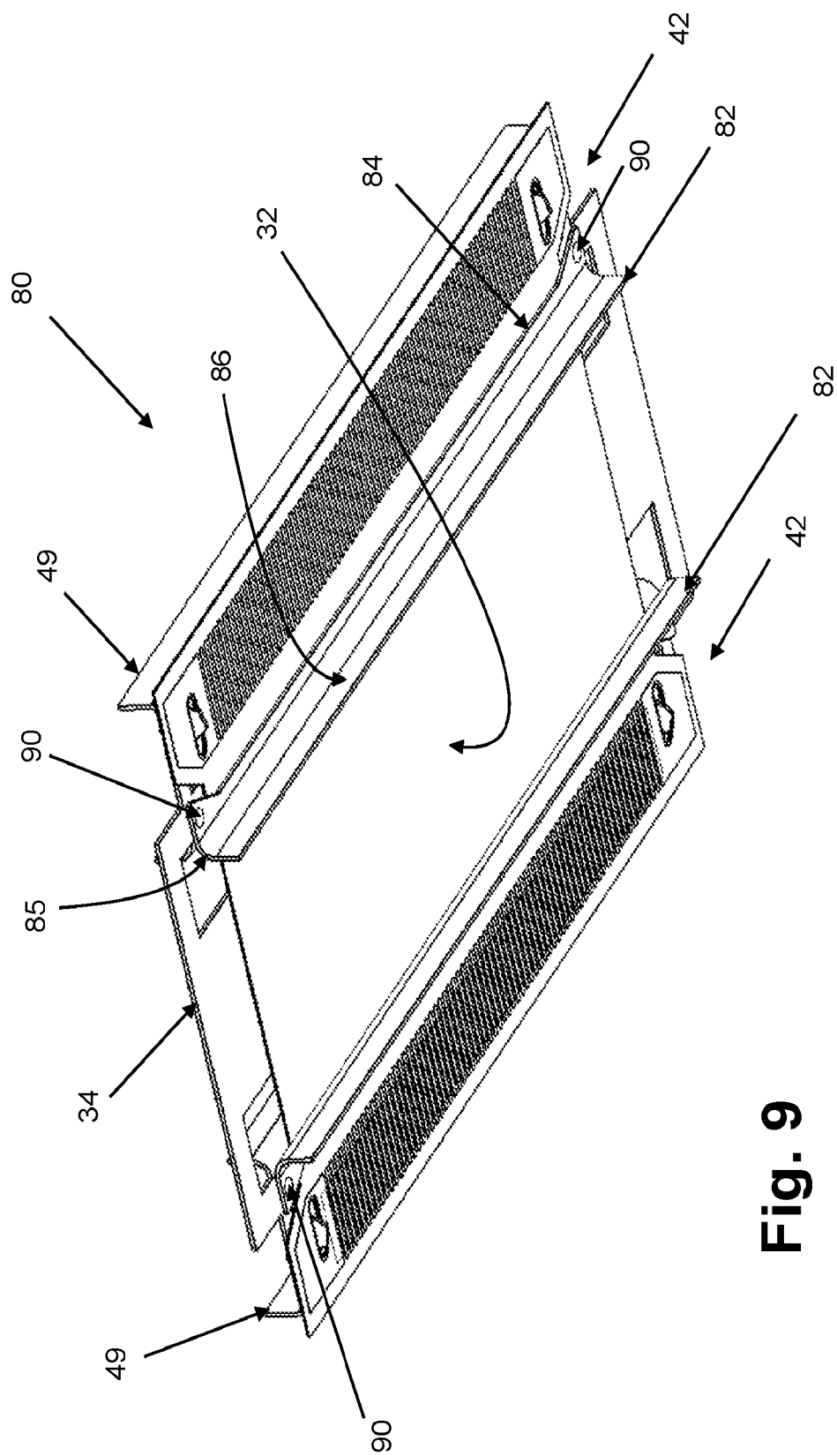
FIG. 9 is a bottom perspective view of a jumper assembly constructed in accordance with a second embodiment.

After the formation of the solder joints between the flexible circuit 32 and the first and second PCBs 10, 12 has been completed, the bridge section 40 of the frame 34 is excised (removed) from the PCB assembly 70. The bridge section 40 is removed by cutting the sacrificial members 43, at the scores or elsewhere, using a punch and die, or a laser, or some other cutting means. The PCB assembly 70 without the bridge section 40 is shown in FIG. 7. With the bridge section 40 removed, the first and second PCBs 10,12 are connected together physically and electrically and may be moved relative to each other by bending the flexible circuit 32. For example, the second PCB 12 may be moved upward and over relative to the first PCB 10 such that the first and second PCBs 10, 12 face each other in a parallel manner, as shown in FIG. 8. With the first and second PCBs 10, 12 so positioned, the side retainers 42 face each other and the flexible circuit 32 is bent over the bends of the first rails 48 at about 90° angles, respectively. The bends facilitate and support the bending of the flexible circuit 32 so it is not damaged.

Figure 12:
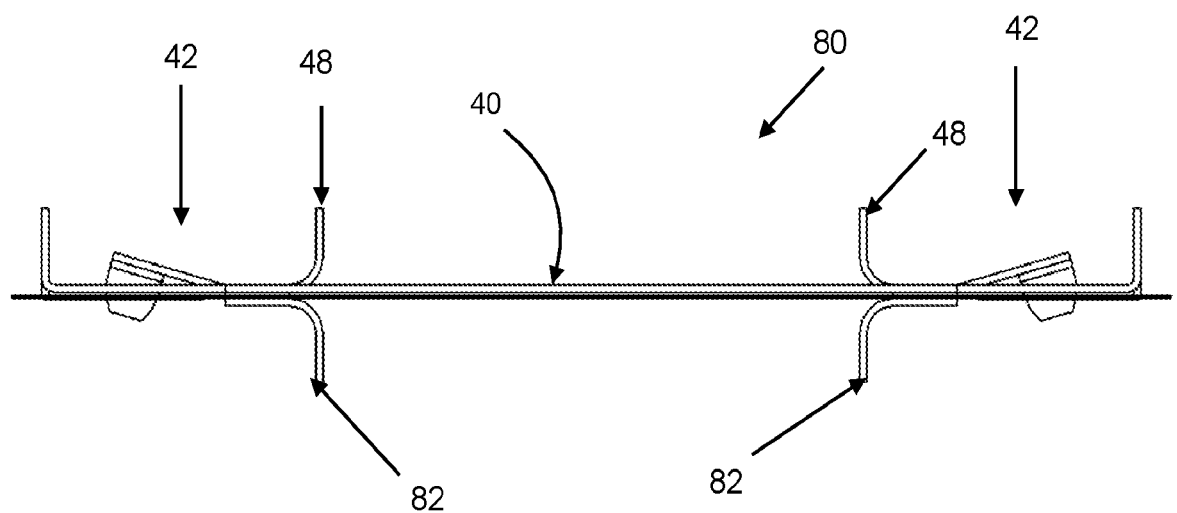
FIG. 12 is a front elevational view of the jumper assembly of FIG. 9.

Referring now to FIGS. 9-12, there is shown a jumper assembly 80 constructed in accordance with a second embodiment. The jumper assembly 80 has the same construction as the jumper assembly 30, except the jumper assembly 80 further includes a pair of channel rails 82 secured to the frame 34. Each channel rail 82 has an L-shaped cross section and includes a base 84 joined at a bend 85 of about 90° to a flange 86. Each base 84 has opposing end portions that flare outwardly. The end portions of the bases 84 are secured to bottom sides of the base structures 44 of the side retainers 42, respectively. The end portions are secured to the side retainers 42 at securement points 90 formed by mechanical clinches or welding. The flexible circuit 32 does not extend longitudinally outward as far as the end portions, which permits the end portions to be directly secured to the side retainers 42 at the securement points 90. Elsewhere, the flexible circuit 32 is clamped between the bases 84 of the channel rails 82 and the side retainers 42. The flanges 86 are laterally aligned with the first rails 48, but extend in opposing directions, as best shown in FIG. 12.

Figure 11:
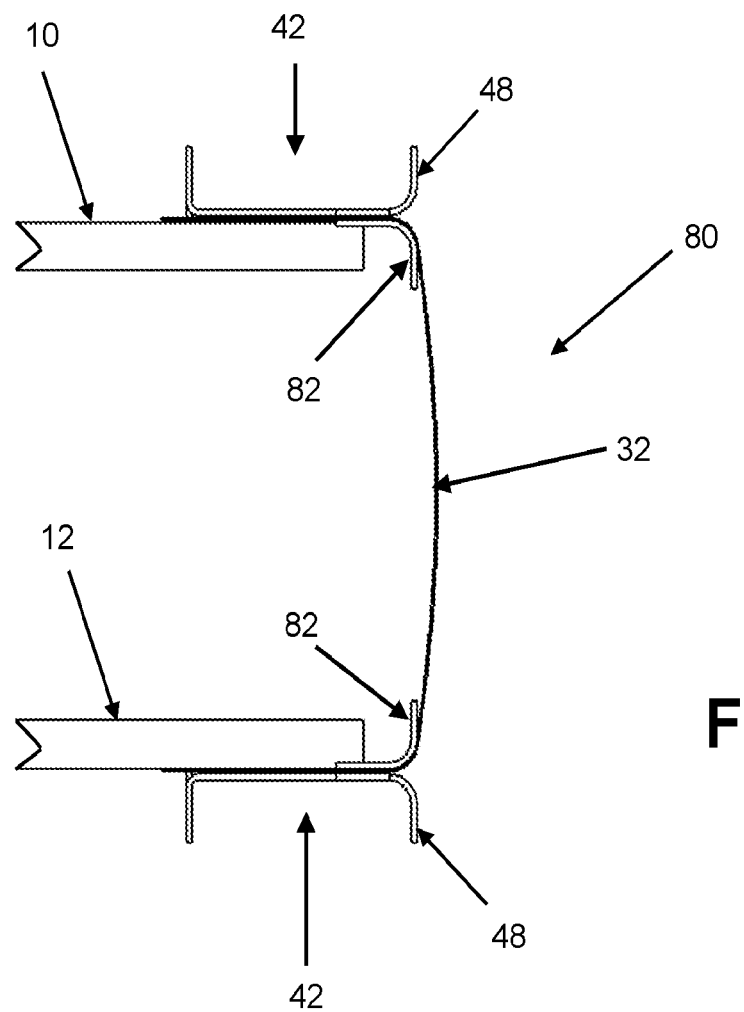
FIG. 11 is a partial side view of the jumper assembly of FIG. 10 connecting together two PCBs.

The jumper assembly 80 may be secured to the first and second PCBs 10, 12 in the same manner (described above) as the jumper assembly 30. When the jumper assembly 80 is so secured and the bridge section 40 is excised, the first and second PCBs 10,12 may be moved relative to each other so that they face each other, with the side retainers 42 directly facing each other, just like the jumper assembly 30 is shown doing in FIG. 8. The jumper assembly 80, however, is also adapted to facilitate the movement of the second PCB 12 in the opposite direction, i.e., downward and below the first PCB 10 so that the side retainers 42 do not face each other. Instead, both of the side retainers 42 face outwardly, as shown in FIGS. 10 and 11. This downward movement of the second PCB 12 is facilitated by the bends 85 in the channel rails 82. More specifically, the downward movement of the second PCB 12 causes the flexible circuit 32 to bend over the bends 85, which facilitate and support the bending of the flexible circuit 32 so it is not damaged. In this manner, the jumper assembly 80 facilitates the bending of the flexible circuit 32 in a bending range of 180°.

It should be appreciated that instead of being provided and secured to the frame 34 as separate pieces, the channel rails 82 may be provided as parts of a single, supplementary frame that is secured to the frame 34. In such an embodiment, the supplementary frame may include a bridge section connected between the channel rails 82. The bridge section may be connected to the channel rails 82 by sacrificial members. After the channel rails 82 are secured to the base structures 44 of the side retainers 42, the bridge section may be excised from the supplementary frame, leaving just the channel rails 82.

Figure 13:
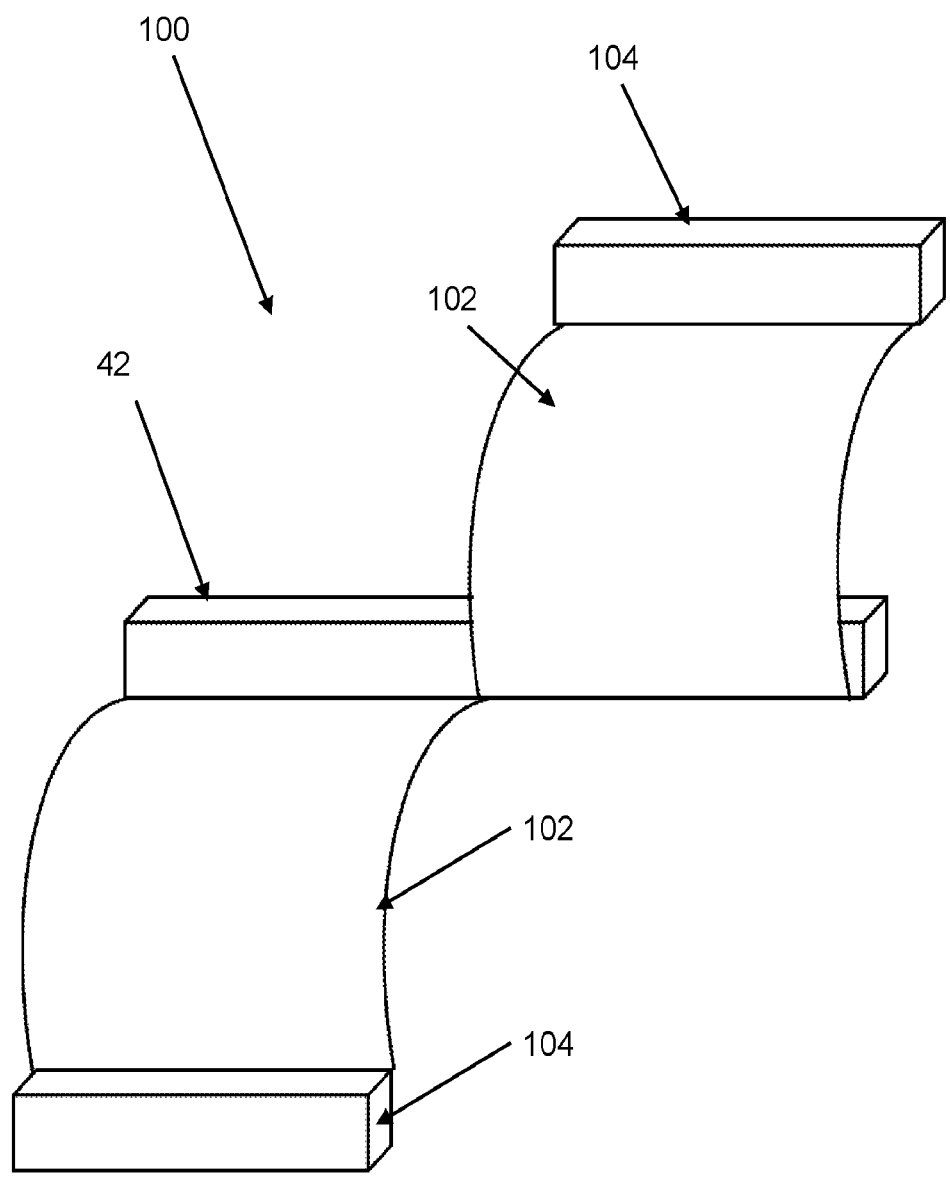
FIG. 13 is a schematic view of a jumper assembly constructed in accordance with a third embodiment, wherein a bridge section of the frame of the jumper assembly has been removed.

Referring now to FIG. 13, there is shown another jumper assembly 100 constructed in accordance with a third embodiment. The jumper assembly 100 includes a flexible circuit 102, which has the same construction as the flexible circuit 32, except the flexible circuit 102 is at least partially bifurcated. One unitary side of the flexible circuit 102 is secured to a side retainer 42, while the other, separated side of the flexible circuit 102 is secured to a pair of separate side retainers 104. Each of the side retainers 104 has a construction substantially similar to a side retainer 42.

The construction of the jumper assembly 100 allows the separated side of the flexible circuit 102 to be connected to two separated printed circuit boards (PCBs) or to a common PCB, with widely separated groups of pads.

Various additional modifications may be made to the jumper assemblies 30, 80, 100.

For example, in some embodiments, the levers 54 may not be provided with anchors 56. In these embodiments, the levers 54 may be narrower and have a more tapered shape. It has been found that even without the anchors 56, the downward movement of the levers 54 still causes the side retainers 42 to lie flat against the flex circuit 32 (and the PCBs 10, 12 below) to help secure the flex circuit 32 to the PCBs 10, 12.

In other embodiments, other anchors, in addition to, or in lieu of, the anchors 56 (attached to the levers 54) may be provided. These other anchors may extend downwardly from interior edges of the base structures 44 and/or the second rails 49 of the side retainers 42. These other anchors may be solid and contoured or have a spring-type construction (e.g. EON). The other anchors may be securely disposed in corresponding openings made in the PCBs 10, 12.

As mentioned above, in some embodiments, the trace pads 36 and the end pads 41 of the flexible circuit 32 may be secured to the contact pads 18 and the anchor pads 20, respectively, of the first and second PCBs 10, 12 without using solder. In these embodiments, solder past is not applied to the contact pads 18 and the anchor pads 20 of the first and second PCBs 10, 12, as described above. Otherwise, the jumper assembly 30, 80, 100 is positioned relative to the first and second PCBs 10, 12 and mechanically secured therebetween using the anchors 56, as described earlier for the jumper assembly 30. With the jumper assembly 30, 80, 100 so positioned and mechanically secured between the first and second PCBs 10, 12, a compression assembly is used to press the trace pads 36 and the end pads 41 of the flexible circuit 32 against the contact pads 18 and the anchor pads 20 of the first and second PCBs 10, 12, respectively, to make solderless and removable electrical connections therebetween. The compression assembly may have a conformable interface to accommodate typical flatness variations in the flexible circuit 32 and the first and second PCBs 10, 12.

Figure 14:
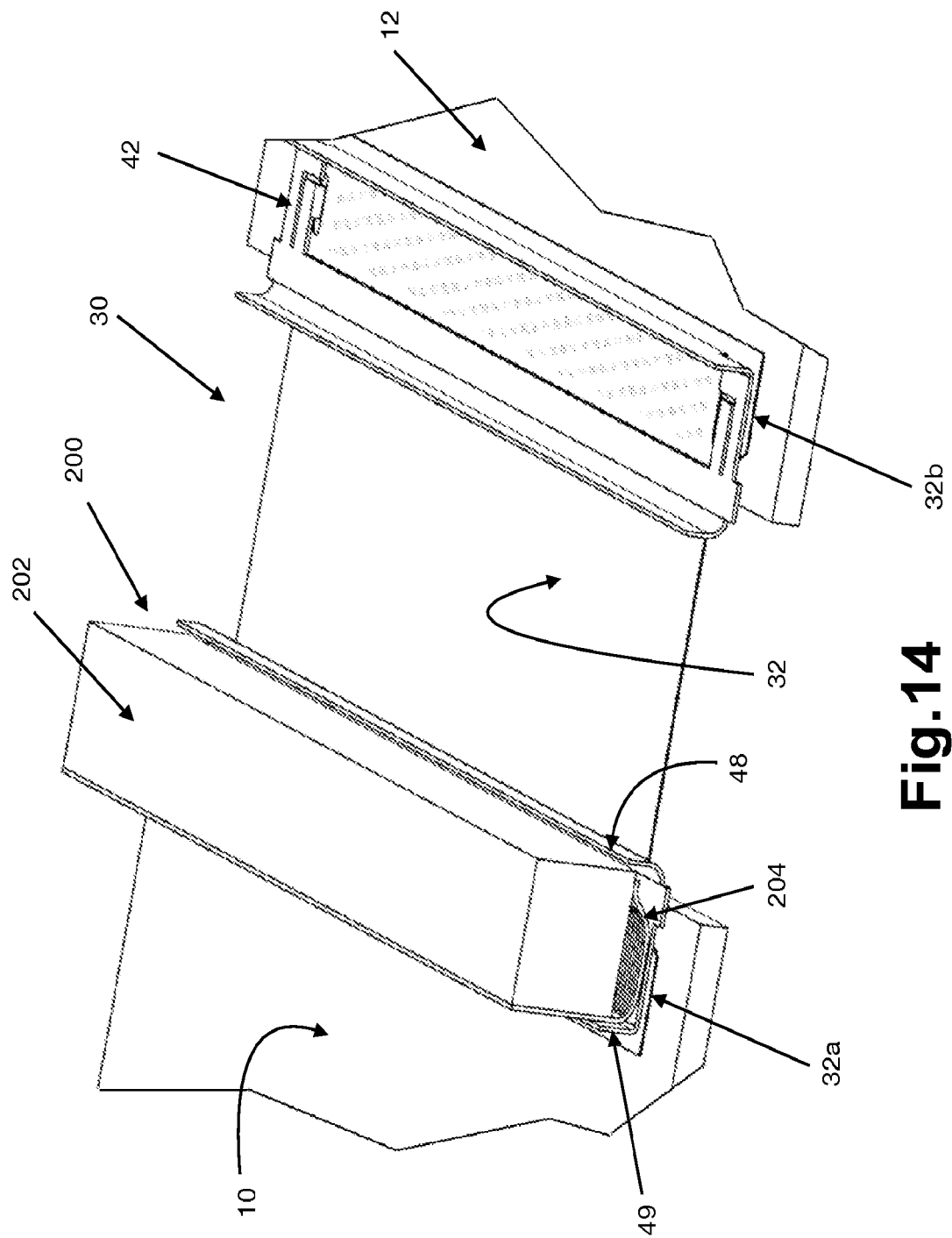
FIG. 14 shows a top perspective view of the jumper assembly of FIG. 2 positioned between portions of the two PCBs, wherein a bridge section of the frame of the jumper assembly has been removed, and wherein a first compression assembly is being used to press a side portion of the flexible circuit against one of the PCBs to make solderless connections therebetween.

A first compression assembly 200 that may be used is shown in FIGS. 14 and 15. The first compression assembly 200 includes an elongated push bar 202 and a stamped pusher 204, which may be secured together. The pusher 204 is stamped from relatively thin metal and may include an interface 206 joined to a mounting plate 208 so as to provide the pusher 204 with a general L-shape. The mounting plate 208 may be secured to a side of the push bar 202. The interface 206 is bowed and stamped to have slots that form a series of deflectable bowed strips. In this manner, the interface 206 is resiliently conformable.

As shown in FIG. 14, the first compression assembly 200 is placed between the first and second rails 48, 49 of a side retainer 42 overlying the side portion 32a of the flexible circuit 32, with the interface 206 in contact with the side portion 32a inside the window 50 of the side retainer 42. A force is then applied to a top of the push bar 202 to press the interface 206 against the side portion 32a, thereby pressing the trace pads 36 and the end pads 41 of the side portion 32a against the contact pads 18 and the anchor pads 20 of the first PCB 10 to make solderless electrical connections therebetween. The first compression assembly 200 is used in a similar manner to press the trace pads 36 and the end pads 41 of the side portion 32b against the contact pads 18 and the anchor pads 20 of the second PCB 12 to make solderless electrical connections therebetween.

A second compression assembly 220 that may be used is shown in FIG. 16. The second compression assembly 220 includes an elongated push bar 222 and an elastomeric interface 224. The interface 224 is formed from an elastomeric material, such as rubber, and, thus, is resiliently conformable. The interface 224 may be secured to a bottom of the push bar 222.

The second compression assembly 220 is used in a similar manner as the first compression assembly 200. The second compression assembly 220 is placed between the first and second rails 48, 49 of a side retainer 42 overlying the side portion 32a of the flexible circuit 32, with the interface 224 in contact with the side portion 32a inside the window 50 of the side retainer 42. A force is then applied to a top of the push bar 222 to press the interface 224 against the side portion 32a, thereby pressing the trace pads 36 and the end pads 41 of the side portion 32a against the contact pads 18 and the anchor pads 20 of the first PCB 10 to make a solderless electrical connection therebetween. The second compression assembly 220 is used in a similar manner to press the trace pads 36 and the end pads 41 of the side portion 32b against the contact pads 18 and the anchor pads 20 of the second PCB 12 to make solderless electrical connections therebetween.

In other embodiments, a compression assembly may utilize an interface that comprises a fluid-containing bladder.

With both the first and second compression assemblies 200, 220, the flexible printed circuit 32 and/or the interface 206, 224 may be provided with surface treatment(s) that enhance the friction between the printed circuit 32 and the first and second PCBs 10, 12 to help prevent lateral movement during assembly and use that may cause misalignment of the pads.

It should be appreciated that a single compression assembly 200, 220 may be used sequentially or that a pair of the compression assemblies 200, 220 may be used at the same time to simultaneously press the side portions 32a,b inside the two side retainers 42 against the first and second PCBs 10, 12, respectively. The pair of compression assemblies 200, 220 may be connected together.

A compression assembly 200, 220 may be used to secure the trace pads 36 and the end pads 41 of the flexible circuit 32 to the contact pads 18 and the anchor pads 20, respectively, of the first and second PCBs 10, 12 either before or after the bridge section 40 has been excised from the frame 34. While FIGS. 14 and 16 show the bridge section 40 as having been excised before the use of the compression assembly 200, 220, the bridge section 40 is usually excised after the use of the compression assembly.

Some of the benefits of the jumper assemblies 30, 80, 100 and their constituent parts are as follows:

Strain relief: The frame 34 provides planar rigidity for vacuum pick-up and placement, such as by a robot. The bridge section 40 offers a large area for forming a secure vacuum as a robot delivers the jumper assembly 30 to the first and second PCBs 10, 12. Before and during the solder reflow, the frame 34 and the levers 54 prevent pad alignment from slipping; this is accomplished through the interplay of metal structure, adhesive bond, and sidenail solder joints. The frame 34 protects the flexible circuit 32 from handling stresses in downstream assembly and handling.

Flatness: The natural straightness of the first and second rails 48, 49 ensure all pads 36, etc. of the flexible circuit 32 are flush against the PCB pads 18, 20 when the levers 54 are pushed down. The flexure of the narrow strips 52 next to the levers 54 allow the first and second rails 48, 49 to become coplanar to each other when the levers 54 are engaged Hold-down Force: The residual tension in the levers 54 exert a downward force on the frame 34. This in turn, forces the flexible circuit 32 flush against the PCB pads 18, 20.

Pad alignment: The large open windows 50 of the frame 34 allow for alignment fiducials 39 to be used. The levers 54 engage the flats of the bores 22, so they exert no sideways action on the assembly as the jumper assembly 30 and the PCBs are engaged. This ensures the pads do not lose the alignment that was accomplished by the camera-guided placement robot.

Safe bend radius: The large radius of the first rails 48 ensure a safe bend radius for the flexible circuit 32. The flex circuit traces are between two dielectric layers to provide neutral bend stresses.

Low cost: The flexible circuit 32 may be one-sided with a dielectric cover. The metal of the frame 34 may be a low-cost alloy. Efficient tape-n-reel packaging.

It is to be understood that the description of the foregoing exemplary embodiment(s) is (are) intended to be only illustrative, rather than exhaustive. Those of ordinary skill will be able to make certain additions, deletions, and/or modifications to the embodiment(s) of the disclosed subject matter without departing from the spirit of the disclosure or its scope.

What is claimed is:

1. A jumper assembly for connecting together first and second circuit structures, the jumper assembly comprising:
a flexible circuit comprising a plurality of conductive traces adjoining at least one dielectric layer, the conductive traces having first and second end portions disposed in first and second side portions of the flexible circuit, respectively, and being exposed through the at least one dielectric layer;
a frame secured to the flexible circuit, the frame comprising first and second side structures connected together by a bridge, the first side structure defining a first window and including at least one first fastener that is movable to engage the first circuit structure, and the second side structure defining a second window and including at least one second fastener that is movable to engage the second circuit structure;
wherein the first side structure is disposed over the first side portion of the flexible circuit such that the first end portions of the flexible circuit are aligned with the first window; and
wherein the second side structure is disposed over the second side portion of the flexible circuit such that the second end portions of the flexible circuit are aligned with the second window.

2. The jumper assembly of claim 1, wherein each of the first and second side structures of the frame is rigid and formed from metal.

3. The jumper assembly of claim 2, wherein the first and second side structures are connected to the bridge by sacrificial members that are weakened to facilitate their separation from the first and second side structures to permit the bridge to be removed from the frame.

4. The jumper assembly of claim 1, wherein the frame is a unitary metal structure, and the flexible circuit has opposing planar top and bottom surfaces.

5. The jumper assembly of claim 4, wherein the first side structure of the frame further includes at least one first top rail that extends along a length of the flexible circuit and projects outwardly, away from the top surface of the flexible circuit; and
wherein the second side structure of the frame further includes at least one second top rail that extends along a length of the flexible circuit and projects outwardly, away from the top surface of the flexible circuit.

6. The jumper assembly of claim 5, wherein the at least one first top rail comprises a pair of first top rails that are spaced-apart and bracket the first window; and
wherein the at least one second top rail comprises a pair of second top rails that are spaced-apart and bracket the second window.

7. The jumper assembly of claim 6, wherein the first side structure of the frame further includes a first base structure connected by first strips to a laterally-outward one of the first top rails, the first window extending longitudinally between the first strips; and
wherein the second side structure of the frame further includes a second base structure connected by second strips to a laterally-outward one of the second top rails, the second window extending longitudinally between the second strips.

8. The jumper assembly of claim 7, wherein the at least one first fastener comprises a pair of first fasteners, one of the first fasteners being disposed proximate to one of the first strips and the other one of the first fasteners being disposed proximate to the other one of the first strips; and wherein the at least one second fastener comprises a pair of second fasteners, one of the second fasteners being disposed proximate to one of the second strips and the other one of the second fasteners being disposed proximate to the other one of the second strips.

9. The jumper assembly of claim 8, wherein each of the first fasteners comprises a first lever connected to the first base structure and having a free end with a first anchor extending downwardly therefrom; and wherein each of the second fasteners comprises a second lever connected to the second base structure and having a free end with a second anchor extending downwardly therefrom.

10. The jumper assembly of claim 9, wherein the traces are spaced apart and extend laterally between the first and second side portions of the flexible circuit;

wherein the first end portions of the traces are bracketed by a pair of first holes extending through the flexible circuit, and the second end portions of the traces are bracketed by a pair of second holes extending through the flexible circuit;

wherein each of the first levers is moveable between a disengaged position in which the first lever extends obliquely from the first base structure and an engaged position in which the first lever is substantially flush with an adjacent one of the first strips, wherein when the first levers are in the engaged positions, the first anchors extend through the first holes of the flexible circuit, respectively; and wherein each of the second levers is moveable between a disengaged position in which the second lever extends obliquely from the second base structure and an engaged position in which the second lever is substantially flush with an adjacent one of the second strips, wherein when the second levers are in the engaged positions, the second anchors extend through the second holes of the flexible circuit, respectively.

11. A circuit assembly comprising the jumper assembly of claim 10 and the first and second circuit structures, the first circuit structure comprising a first circuit board and including an array of first contact pads bracketed by a pair of first bores extending through the first circuit board, and the second circuit structure comprising a second circuit board and including an array of second contact pads bracketed by a pair of second bores extending through the second circuit board;

wherein the first levers of the first fasteners are in the engaged positions such that the first anchors of the first fasteners are securely disposed within the first bores of the first circuit board, and wherein the second levers of the second fasteners are in the engaged positions such that the second anchors of the second fasteners are securely disposed within the second bores of the second circuit board; and wherein the first end portions of the traces of the flexible circuit are secured to the first contact pads of the first circuit board and the second end portions of the traces of the flexible circuit are secured to the second contact pads of the second circuit board.

12. The circuit assembly of claim 11, wherein the first end portions of the traces of the flexible circuit are secured to the first contact pads of the first circuit board by solder and the second end portions of the traces of the flexible circuit are secured to the second contact pads of the second circuit board by solder.

13. The jumper assembly of claim 1, wherein the frame is secured to the flexible circuit by adhesive, mechanical clinches and/or solder.

14. A method of forming a circuit assembly, the method comprising:

(a.) providing first and second circuit boards, the first circuit board including an array of first contact pads, and the second circuit board including an array of second contact pads;

(b.) providing a jumper assembly comprising:
a flexible circuit comprising a plurality of conductive traces adjoining at least one dielectric layer, the conductive traces having first and second end portions disposed in first and second side portions of the flexible circuit, respectively, and being exposed through the at least one dielectric layer;
a frame secured to the flexible circuit, the frame comprising first and second side structures connected together by a bridge, the first side structure defining a first window and including at least one first fastener that is movable to engage the first circuit structure, and the second side structure defining a second window and including at least one second fastener that is movable to engage the second circuit structure;
wherein the first side structure is disposed over the first side portion of the flexible circuit such that the first end portions of the flexible circuit are aligned with the first window; and
wherein the second side structure is disposed over the second side portion of the flexible circuit such that the second end portions of the flexible circuit are aligned with the second window;

(c.) positioning the jumper assembly over the first and second circuit boards such that the first side structure is disposed over the first circuit board and the second side structure is disposed over the second circuit board;

(d.) securing the first end portions of the traces of the flexible circuit to the first contact pads of the first circuit board;

(e.) securing the second end portions of the traces of the flexible circuit to the second contact pads of the second circuit board; and (f.) removing the bridge from the frame.

15. The method of claim 14, wherein the steps of securing the first end portions of the traces of the flexible circuit to the first contact pads of the first circuit board and securing the second end portions of the traces of the flexible circuit to the second contact pads of the second circuit board are performed with the first and second circuit boards being spaced-apart and at least partially coplanar.

16. The method of claim 15, further comprising moving the first and second circuit boards relative to each other after the bridge has been removed, the first and second circuit boards being moved relative to each other such that the first and second circuit boards face each other.

17. The method of claim 15, wherein the first side structure of the frame further includes a first top rail that extends along a length of the flexible circuit and projects outwardly, away from a top surface of the flexible circuit;

wherein the second side structure of the frame further includes a second top rail that extends along a length of the flexible circuit and projects outwardly, away from a top surface of the flexible circuit; and wherein the step of moving the first and second circuit boards bends a portion of the flexible circuit over the first top rail and bends another portion of the flexible circuit over the second top rail, the flexible circuit being bent over each of the first and second rails at about a 90° angle.

18. The method of claim 17, wherein in the first circuit board, the array of the first contact pads is bracketed by a pair of first bores extending through the first circuit board, and in the second circuit board, the array of the second contact pads is bracketed by a pair of second bores extending through the second circuit board;
- wherein the at least one first fastener comprises a pair of first fasteners, and the at least one second fastener comprises a pair of second fasteners;
- wherein each of the first fasteners comprises a first lever connected to a first base structure of the first side structure, the first lever having a free end with a first anchor extending downwardly therefrom, the first levers being moveable between engaged and disengaged positions;
- wherein each of the second fasteners comprises a second lever connected to a second base structure of the second side structure, the second lever having a free end with a second anchor extending downwardly therefrom, the second levers being moveable between engaged and disengaged positions; and
- wherein when the jumper assembly is provided, the first and second levers are in the disengaged positions, in which the first and second levers extend obliquely from the first and second base structures, respectively.

19. The method of claim 18, further comprising:
after the jumper is positioned over the first and second circuit boards, moving the first and second levers to the engaged positions, thereby causing the first anchors to move into the first bores of the first circuit board, respectively, and the second anchors to move into the second bores of the second circuit board.

20. The method of claim 14, wherein the securing of the first end portions of the traces of the flexible circuit to the first contact pads of the first circuit board is performed by pressing the first end portions of the traces against the first contact pads of the first circuit board using at least one compression assembly that includes at least one conformable interface that is placed against a top surface of the first side portion of the flexible circuit, whereby the pressing makes solderless electrical connections between the first end portions of the traces of the flexible circuit and the first contact pads of the first circuit board; and
wherein the securing of the second end portions of the traces of the flexible circuit to the second contact pads of the second circuit board is performed by pressing the second end portions of the traces against the second contact pads of the second circuit board using the at least one compression assembly in which the at least one conformable interface is placed against a top surface of the second side portion of the flexible circuit, whereby the pressing makes solderless electrical connections between the second end portions of the traces of the flexible circuit and the second contact pads of the second circuit board.

* * * * *